United States Patent
Chui et al.

(10) Patent No.: US 10,355,111 B2
(45) Date of Patent: Jul. 16, 2019

(54) DEPOSITION SELECTIVITY ENHANCEMENT AND MANUFACTURING METHOD THEREOF

(71) Applicant: Taiwan Semiconductor Manufacturing Company, Ltd., Hsinchu (TW)

(72) Inventors: Chi On Chui, Hsinchu (TW); Bo-Cyuan Lu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/694,636

(22) Filed: Sep. 1, 2017

(65) Prior Publication Data
US 2018/0315840 A1    Nov. 1, 2018

Related U.S. Application Data

(60) Provisional application No. 62/490,468, filed on Apr. 26, 2017.

(51) Int. Cl.
| | |
|---|---|
| *H01L 29/66* | (2006.01) |
| *H01L 21/02* | (2006.01) |
| *H01L 21/28* | (2006.01) |
| *H01L 21/3105* | (2006.01) |
| *H01L 21/32* | (2006.01) |

(52) U.S. Cl.
CPC .... *H01L 29/66818* (2013.01); *H01L 21/0217* (2013.01); *H01L 21/0228* (2013.01); *H01L 21/02126* (2013.01); *H01L 21/02304* (2013.01); *H01L 21/02312* (2013.01); *H01L 21/28132* (2013.01); *H01L 21/3105* (2013.01); *H01L 29/66545* (2013.01); *H01L 29/66553* (2013.01); *H01L 21/32* (2013.01)

(58) Field of Classification Search
CPC .................................................. H01L 21/0217
See application file for complete search history.

(56) References Cited

U.S. PATENT DOCUMENTS

| | | | |
|---|---|---|---|
| 2006/0199384 A1* | 9/2006 | Ando | C23C 16/401 438/680 |
| 2011/0120543 A1* | 5/2011 | Levy | C23C 16/04 136/256 |
| 2016/0322213 A1* | 11/2016 | Thompson | H01L 21/0228 |

FOREIGN PATENT DOCUMENTS

KR    1020160130165 A    11/2016

* cited by examiner

*Primary Examiner* — William A Harriston
(74) *Attorney, Agent, or Firm* — Slater Matsil, LLP

(57) ABSTRACT

A method includes depositing an inhibitor layer on a first surface, depositing a film on a second surface by performing a first set of deposition cycles. Each deposition cycle includes adsorbing a first precursor over the second surface, performing a first purge process, adsorbing a second precursor over the second surface, and performing a second purge process. The method also includes performing a third purge process that is different from the first purge process or the second purge process.

20 Claims, 15 Drawing Sheets

DEPOSITION SELECTIVITY ENHANCEMENT AND MANUFACTURING METHOD THEREOF

PRIORITY CLAIM AND CROSS-REFERENCE

This patent application claims priority to U.S. Provisional Application No. 62/490,468, filed on Apr. 26, 2017 and entitled "Deposition Selectivity Enhancement and Manufacturing Method Thereof," which application is hereby incorporated herein by reference in its entirety.

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, forming dummy gate electrodes on the semiconductor fins, etching end portions of the semiconductor fins, performing an epitaxy to regrow source/drain regions, and forming contact plugs on the gate electrodes and source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
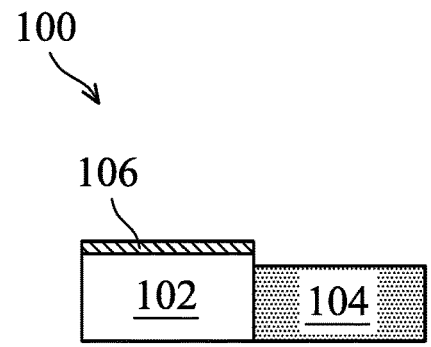
FIGS. 1A-1I illustrate a process flow for selective deposition in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for selective deposition on surfaces during FinFET formation. In some cases, the use of a selective deposition process such as that described herein can allow for fewer processing steps and less material deposited in unwanted regions. With regard to a deposition process, a deposition's selectivity is a measure of a maximum film thickness deposited on a target surface without nucleation or build-up on an inhibitor-coated surface. In some cases, film deposition selectivity is limited by concurrent and/or delayed nucleation on an inhibitor-coated surface due to mechanisms including but not limited to precursor physisorption or other mechanisms. To prevent or delay film nucleation on an inhibitor-coated surface so as to enhance deposition selectivity, the present disclosure discusses embodiments which involve single or multiple intermittent purges during the film deposition process.

FIGS. 1A-1I illustrate example steps of a selective deposition process according to an embodiment. In particular, FIGS. 1A-1I illustrate cross-sectional views of intermediate steps in the formation of an example device 100. Some steps shown in FIGS. 1A-1I are also illustrated schematically in the process flow 200 shown in FIG. 2.

FIG. 1A illustrates a cross-sectional view of an example device 100 including a first material 102 and a second material 104 in accordance with some embodiments. First material 102 or second material 104 may be, for example, layers formed over a substrate (not shown in FIGS. 1A-1I). First material 102 and second material 104 are different materials. FIGS. 1A-1I depict illustrative examples, and in other cases first material 102 or second material 104 may have different thicknesses, have different heights, include one or more sublayers, have top surfaces that are not level or planar, have top surfaces that are not co-planar, have protrusions or recesses, be partially covered by another material or layer, or have other features or variations as known in the art. In some cases, first material 102 and second material 104 are not fully adjacent as shown in FIGS. 1A-1I. For example, a third material may be present between first material 102 and second material 104. In some embodiments, first material 102 may include a material such as Si, SiN, SiC, SiCN, SiOCN, W, TiN, TaN, SiGe, or another material. In some embodiments, first material 102 may be silicon doped with carbon and/or nitrogen, a metal, a metal nitride, a metal nitride doped with carbon, or another material or combination of materials. In some embodiments, second material 104 may include a material such as $SiO_2$, SiGe, SiP, or another material, with or without a surface oxide layer. In some embodiments, second material 104 may be silicon oxide doped with carbon and/or nitrogen, a metal oxide, or anther material or combination of materials.

FIG. 1A also shows oxide 106 over first material 102. In other cases, oxide 106 may be present over both first material 102 and second material 104, or oxide 106 may not be present at all. Oxide 106 may, for example, be a native oxide, be a deposited oxide, or be another type of dielectric layer. As an illustrative example, the first material 102 may be Si, and oxide 106 may be a native $SiO_2$, though other materials may also be used.

Figure 1B:
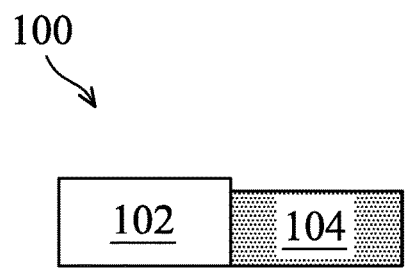
Figure 2:
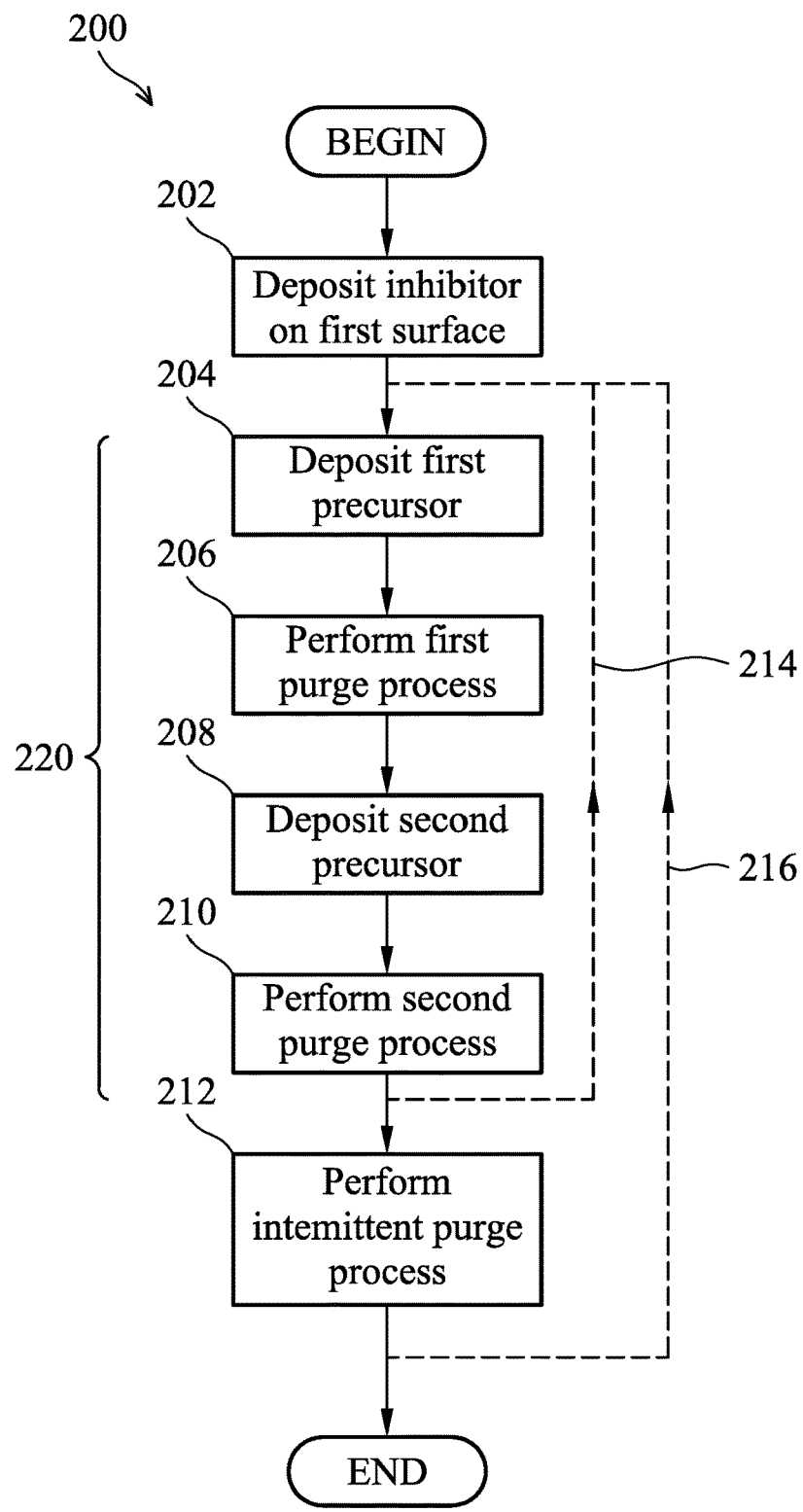
FIG. 2 illustrates a process flow for selective deposition in accordance with some embodiments.

FIG. 1B illustrates an optional oxide removal step in accordance with some embodiments. The oxide removal step removes oxide 106 from first material 102, if oxide 106 is present. In some cases, the oxide removal step may also recess the top surface of second material 104, as shown in FIG. 1B. As an illustrative example, the oxide 106 and the second material 104 may be SiO2, and the oxide removal step may include an HF treatment that removes oxide 106 and recesses second material 104, though other materials and other oxide removal procedures may be used. In other cases, the oxide removal step does not recess the top surface of second material 104. In some cases, the oxide removal step may prepare the surface of first material 102 or second material 104 for subsequent processing. For example, the oxide removal step may form hydroxyl (—OH) terminations on the surface of second material 104.

Figure 1C:
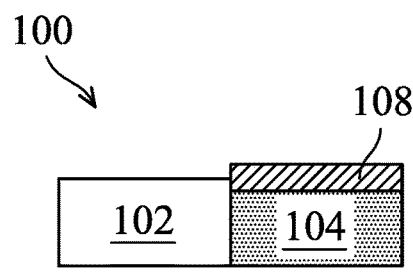

FIG. 1C illustrates the formation of inhibitor 108 on second material 104 in accordance with some embodiments. Inhibitor 108 is formed on second material 104 to suppress the adsorption of precursors on the second material 104 during a subsequent deposition, discussed in greater detail below with regard to FIGS. 1D-1I. Precursors are more likely to adsorb on certain surfaces (such as that of first material 102) and less likely to adsorb on surfaces covered with inhibitor 108, facilitating selective deposition on first material 102 over second material 104. This respective step shown in FIG. 1C is illustrated as step 202 in the process flow 200 shown in FIG. 2. In some cases, inhibitor 108 is formed over first material 102 and second material 104 and then removed from first material 102 using photolithographic techniques or other techniques. In some cases, inhibitor 108 is formed by exposing first material 102 and second material 104 to a chemical process that bonds inhibitor groups to the surface of the second material 104 but not to the surface of the first material 102. In some embodiments, inhibitor 108 may be a self-assembled monolayer formed on the surface of second material 104. In some embodiments, inhibitor 108 may include silyl groups bonded to the surface of the second material 104. For example, the silyl groups may be of the form $R_3Si$, and R may include one or more alkyls such as $CH_3$, $C_2H_5$, or the like. The inhibitor 108 may be formed from a chemical material such as trimethylchlorosilane (TMCS) or another chemical material. In some cases, the inhibitor 108 is formed from a chemical material having a "leaving group" that disassociates from the other groups of the chemical material, allowing the remaining chemical material to bond to —OH on the surface of the second material 104. As an example process, for a Si first material 102 and a $SiO_2$ second material 104, inhibitor 108 may be formed on second material 104 by exposing the second material 104 to an octadecyltrichlorosilane solution followed by a rinsing process including toluene, acetone, or chloroform and then performing a drying process. In other embodiments, inhibitor 108 may be formed using different techniques. In some cases, inhibitor 108 may also be formed over a third material in addition to the second material 104, or a different type of inhibitor may be formed over the third material.

Figure 1D:
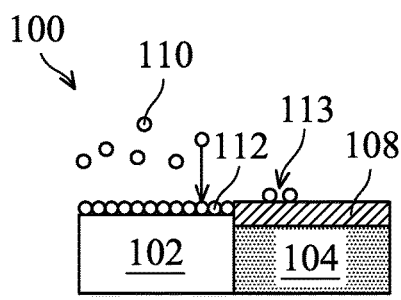

FIGS. 1D-1G illustrate example stages of a single cycle of an Atomic Layer Deposition (ALD) process including two precursors, in accordance with some embodiments. The ALD cycle shown in FIGS. 1D-1G is also illustrated as steps 204-210 in the process flow 200 shown in FIG. 2. In the example shown in FIG. 1D-1G, ALD is used to form a deposition material 122 over first material 102, using first precursor molecules 110 and second precursor molecules 116. FIG. 1D illustrates the first stage of the ALD cycle, which includes adsorption of first precursor molecules 110 onto first material 102 and second material 104. This respective step shown in FIG. 1D is illustrated as step 204 in the process flow 200 shown in FIG. 2. In the first stage of the ALD cycle, first precursor molecules 110 are introduced into the environment around first material 102 and second material 108. First precursor molecules 110 can adsorb onto the exposed surface of first material 102 (an example adsorbed first precursor molecule 112 is labeled in FIGS. 1D-1G). First precursor molecules 110 may adsorb onto first material 102 until the surface of first material 102 is saturated with first precursor molecules 110, as shown in FIG. 1D. In some cases, some first precursor molecules 110 may adsorb onto the surface of second material 104 despite the presence of inhibitor 108 (example unwanted first precursor molecules 113 are labeled in FIGS. 1D-1E).

Figure 1E:
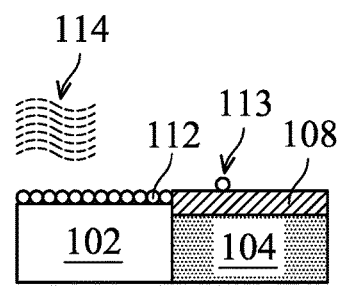

FIG. 1E illustrates the second stage of the ALD cycle, which includes a first purge process to remove unadsorbed first precursor molecules 110 from the environment and to remove unwanted first precursor molecules 113 that have adsorbed onto the surface of second material 104. This respective step shown in FIG. 1E is illustrated as step 206 in the process flow 200 shown in FIG. 2. In some embodiments, the first purge process includes flowing a gas 114 over device 100. Gas 114 may be $N_2$, $Ar_2$, $He_2$, or another gas or combination of gases, including other inert gases. In some embodiments, gas 114 has a pressure of between about 50 torr and about 100 torr, but gas 114 may be at other pressures. In some embodiments, the temperature of the environment during the first purge process is between about 400° C. and about 500° C., though the first purge process may also be performed at a different temperature. In some embodiments, the first purge process includes flowing gas 114 for a duration of time between about 10 seconds and about 20 seconds, though gas 114 may be flowed for other durations of time in other embodiments. In some cases, a number of unwanted first precursor molecules 113 may remain on the surface of second material 104 after the first purge process, as shown in FIG. 1E.

Figure 1F:
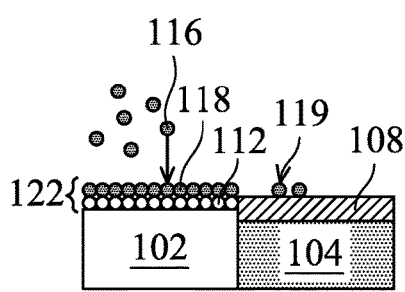

FIG. 1F illustrates the third stage of the ALD cycle, which includes the adsorption of second precursor molecules 116 onto first material 102 and second material 104. In the third stage of the ALD cycle, second precursor molecules 116 are introduced into the environment around first material 102 and second material 108. This respective step shown in FIG. 1F is illustrated as step 208 in the process flow 200 shown in FIG. 2. Second precursor molecules 116 adsorb onto first precursor molecules 110 present on the surface of first material 102 (an example adsorbed second precursor molecule 118 is labeled in FIGS. 1F-1G). Second precursor molecules 110 may adsorb onto first precursor molecules 110 until the first precursor molecules 110 are saturated with second precursor 116 molecules, as shown in FIG. 1F. In some cases, some second precursor molecules 116 may adsorb onto the surface of second material 104 despite the presence of inhibitor 108 (example unwanted second precursor molecules 119 are labeled in FIGS. 1F-1G).

Figure 1G:
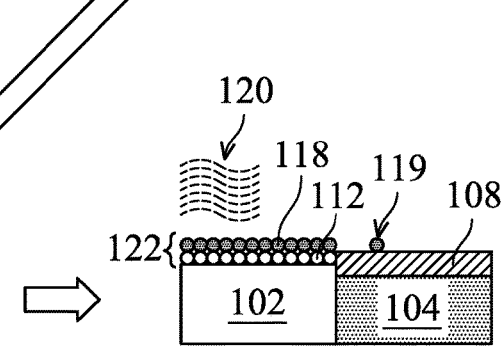

FIG. 1G illustrates the fourth stage of the ALD cycle, which includes a second purge process to remove unadsorbed second precursor molecules 116 from the environment and to remove unwanted first precursor molecules 119 that have adsorbed onto the surface of second material 104. This respective step shown in FIG. 1G is illustrated as step 210 in the process flow 200 shown in FIG. 2. In some embodiments, the second purge process includes flowing a gas 120 over the device 100. The gas 120 may be similar to gas 114 of the first purge process, or gas 120 may be a different gas. Moreover, the pressure, temperature, duration, or other characteristics of the second purge process may be similar to the first purge process or may be different from the first purge process. In some cases, a number of unwanted second precursor molecules 119 may remain on the surface of second material 104 after the second purge process, as shown in FIG. 1G.

After the second purge process of FIG. 1G, the ALD cycle may repeat starting with the first stage shown in FIG. 1D. This is illustrated as the optional process line 214 in the process flow 200 shown in FIG. 2. In the first stage, first precursor molecules 110 adsorb onto the previously deposited second precursor molecules, followed by the first purge process of the second stage of the ALD cycle. Then, in the third stage, second precursor molecules 116 adsorb onto the previously deposited first precursor molecules, followed by the second purge process of the fourth stage of the ALD cycle. In this manner, the ALD cycle may be repeated an arbitrary number of times to form an arbitrarily thick layer of deposition material 122 on the surface of the first material 102, as illustrated in FIG. 1H.

The deposition material 122 may be a material such as SiN, SiOC, SiOCN, or another material, with appropriate precursor materials used during deposition. For example, the deposition of SiN as a deposition material 122 may use $SiH_4$, $SiH_2Cl_2$, $Si2Cl_6$, $SiCl_4$, $SiCl_3H$, $SiBr_4$, $SiH_2I_2$, $SiF_4$, $SiI_4$, or another material as a first precursor and $N_2$, $NH_3$, or another material as a second precursor. The deposition of SiOC may use $SiH_2Cl_2$, $Si_2Cl_6$, $SiCl_4$, $SiCl_3H$, $SiBr_4$, $SiH_2I_2$, $SiF_4$, $SiI_4$, or another material as precursors. In some cases, a deposition material may use more than two precursor materials, and the corresponding ALD cycles may include additional adsorption and purge stages associated with the additional precursor materials. For example, the deposition of SiOCN as a deposition material 122 may use $SiH_2Cl_2$, $Si_2Cl_6$, $SiCl_4$, $SiCl_3H$, $SiBr_4$, $SiH_2I_2$, $SiF_4$, $SiI_4$, or another material as a first precursor $CH_3$, $C_2H_6$, $C_3H_8$, or other alkane groups or alkene groups, or another material as a second precursor, $O_2$, $H_2O$, $H_2O_2$, $O_3$, or another material as a third precursor, and $N_2$, $NH_3$, or another material as a fourth precursor. In some cases, the same precursor material may be used in different stages of the same ALD cycle.

Figure 1H:
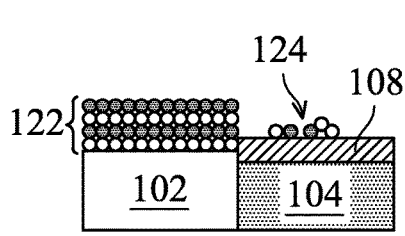

However, as also illustrated in FIG. 1H, despite the first purge process and second purge process performed in each ALD cycle, some unwanted first precursor molecules 113 and unwanted second precursor molecules 119 may remain on the surface of second material 104. This is shown in FIG. 1H by unwanted molecules 124 on the surface of second material 104. In some cases, after multiple ALD cycles, the unwanted molecules 124 can build up on the second material 104 and interfere with subsequent processing steps. For example, the unwanted molecules 124 can cover regions that should remain exposed, contaminate regions with unwanted molecules 124, fill recesses with unwanted molecules 124 that should remain open, cause unwanted merging between separate regions of deposition material 122, or require additional processing steps to be added to remove the unwanted molecules 124.

Figure 1I:
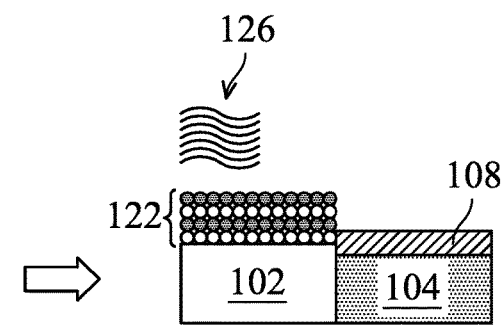

FIG. 1I illustrates an intermittent purge process to remove unwanted molecules 124 from the surface of second material 104. This respective step shown in FIG. 1I is illustrated as step 212 in the process flow 200 shown in FIG. 2. After the intermittent purge process of FIG. 1I, the ALD cycle may repeat starting with the first stage shown in FIG. 1D. This is illustrated as the optional process line 216 in the process flow 200 shown in FIG. 2.

An intermittent purge process may be performed one or more times during the formation of deposition material 122 via one or more ALD cycles. In some embodiments, an intermittent purge process is performed repeatedly during the formation of deposition material 122, an intermittent purge process performed after the completion of one or more ALD cycles. For example, the intermittent purge process may be performed after every ALD cycle, after every 2 ALD cycles, after every 10 ALD cycles, after between about 30 ALD cycles and about 50 ALD cycles, or after another number of ALD cycles. In some cases, the number of ALD cycles between subsequent intermittent purge processes varies. In some cases, an intermittent purge process is performed after an intermediate stage in an ALD cycle. An intermittent purge process may also be repeated more than one time before a new ALD cycle begins, or after an ALD cycle completes.

In some embodiments, the intermittent purge process includes flowing a gas 126 over device 100. The intermittent purge process may be similar to the first purge process shown in FIG. 1E or the second purge process shown in FIG. 1G, but may be different in some embodiments. Gas 126 may be $N_2$, $Ar_2$, $He_2$, or another gas or combination of gases, including other inert gases. In some embodiments, gas 126 has a pressure less than about 500 torr, but gas 126 may be at other pressures. In some embodiments, the temperature of the environment during the intermittent purge process is between about 400° C. and about 500° C., though the intermittent purge process may also be performed at a different temperature. In some embodiments, the intermittent purge process includes flowing gas 126 for a duration of time between about 600 seconds and about 1200 seconds, though gas 126 may be flowed for other durations of time in other embodiments. In some cases, the temperature, pressure, or duration of intermittent purge processes may vary during the formation of deposition material 122.

Through the use of the intermittent purge process described herein, the selectivity of the deposition can be improved, as fewer unwanted precursor molecules remain on the device during and after deposition. In this manner, a thicker deposition material layer may be deposited before unwanted precursor buildup becomes too problematic. Moreover, any need to remove and recoat an inhibitor layer during deposition to remove unwanted precursor buildup may be reduced or eliminated.

FIGS. 3 through 12 illustrate the cross-sectional views and perspective views of intermediate stages in the formation of a FinFET using selective deposition techniques described herein, in accordance with some embodiments.

The fins of a FinFET device may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. Various embodiments presented herein are discussed in the context of FinFETs formed using a gate-last process. In other embodiments, a gate-first process may be used. Also, some embodiments contemplate aspects used in planar devices, such as planar FETs.

Figure 3:
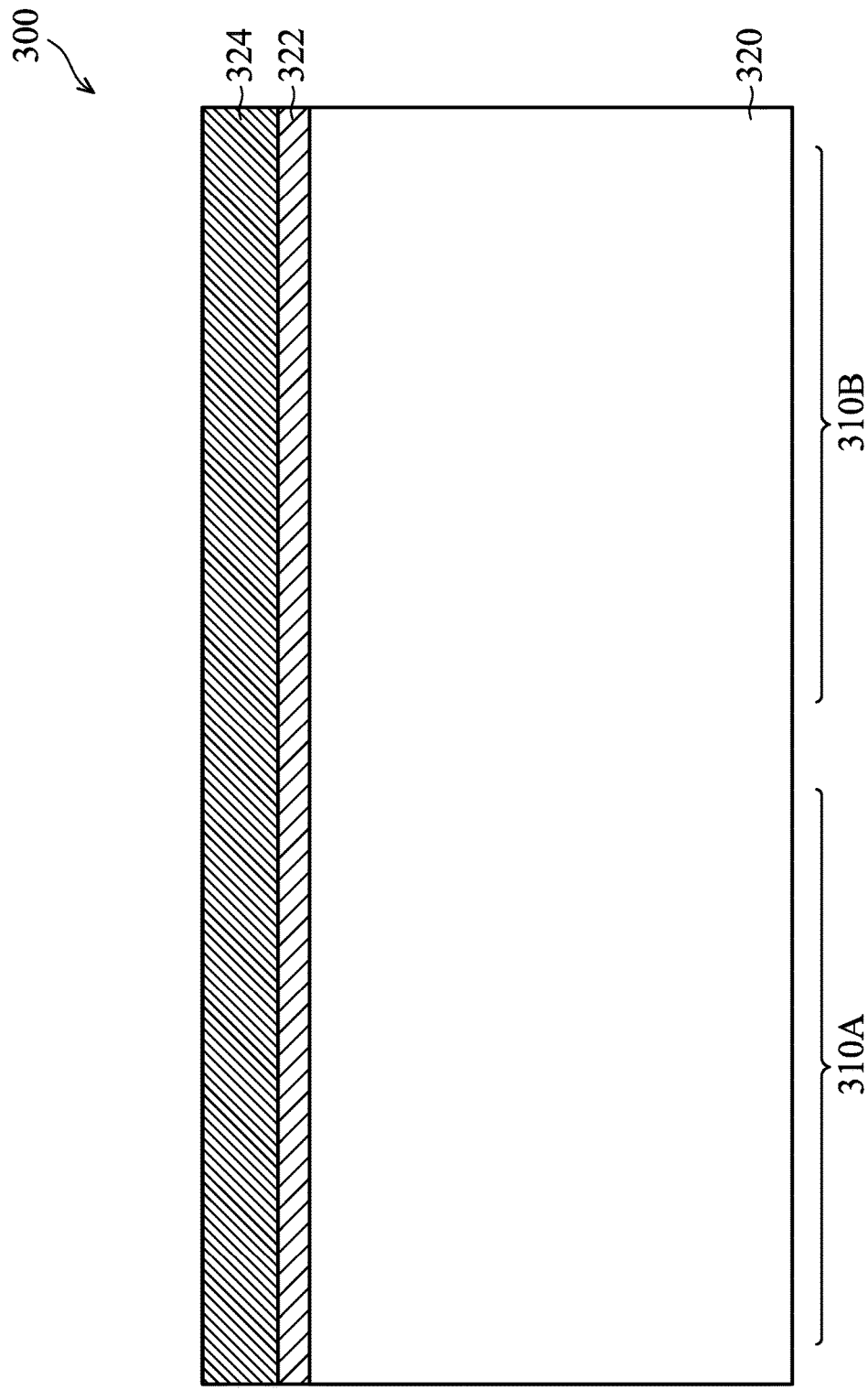
FIGS. 3-8, 9A-9B, 10A-10B, and 11-12 are cross-sectional views and perspective views of intermediate stages in the formation of Fin Field-Effect Transistors (FinFETs) in accordance with some embodiments.

FIG. 3 illustrates a cross-sectional view of substrate 320, which is a part of wafer 300. Substrate 320 may be a bulk substrate or a semiconductor-on-insulator substrate. In accordance with some embodiments of the present disclosure, substrate 320 is formed of a semiconductor material selected from, and not limited to, silicon germanium, silicon carbon, germanium, and III-V compound semiconductor materials such as GaAsP, AlInAs, AlGaAs, GaInAs, GaInP, GaInAsP, and the like. Substrate 320 may be lightly doped with a p-type or an n-type impurity. Wafer 300 includes N-type Metal Oxide Semiconductor (NMOS) region 310A and P-type Metal Oxide Semiconductor (PMOS) region 310B, in which a NMOS transistor and a PMOS transistor, respectively, are to be formed.

Pad oxide 322 and hard mask 324 are formed over semiconductor substrate 320. In accordance with some embodiments of the present disclosure, pad oxide 322 is formed of silicon oxide, which may be formed by oxidizing a surface layer of semiconductor substrate 320. Hard mask 324 may be formed of silicon nitride (SiN), silicon oxynitride (SiON), silicon carbide (SiC), silicon carbo-nitride (SiCN), SiOCN, or the like. In accordance with some embodiments of the present disclosure, mask layer 324 is formed of SiN, for example, using Low-Pressure Chemical Vapor Deposition (LPCVD). In accordance with other embodiments of the present disclosure, mask layer 324 is formed by thermal nitridation of silicon, Plasma Enhanced Chemical Vapor Deposition (PECVD), or plasma anodic nitridation.

Figure 4:
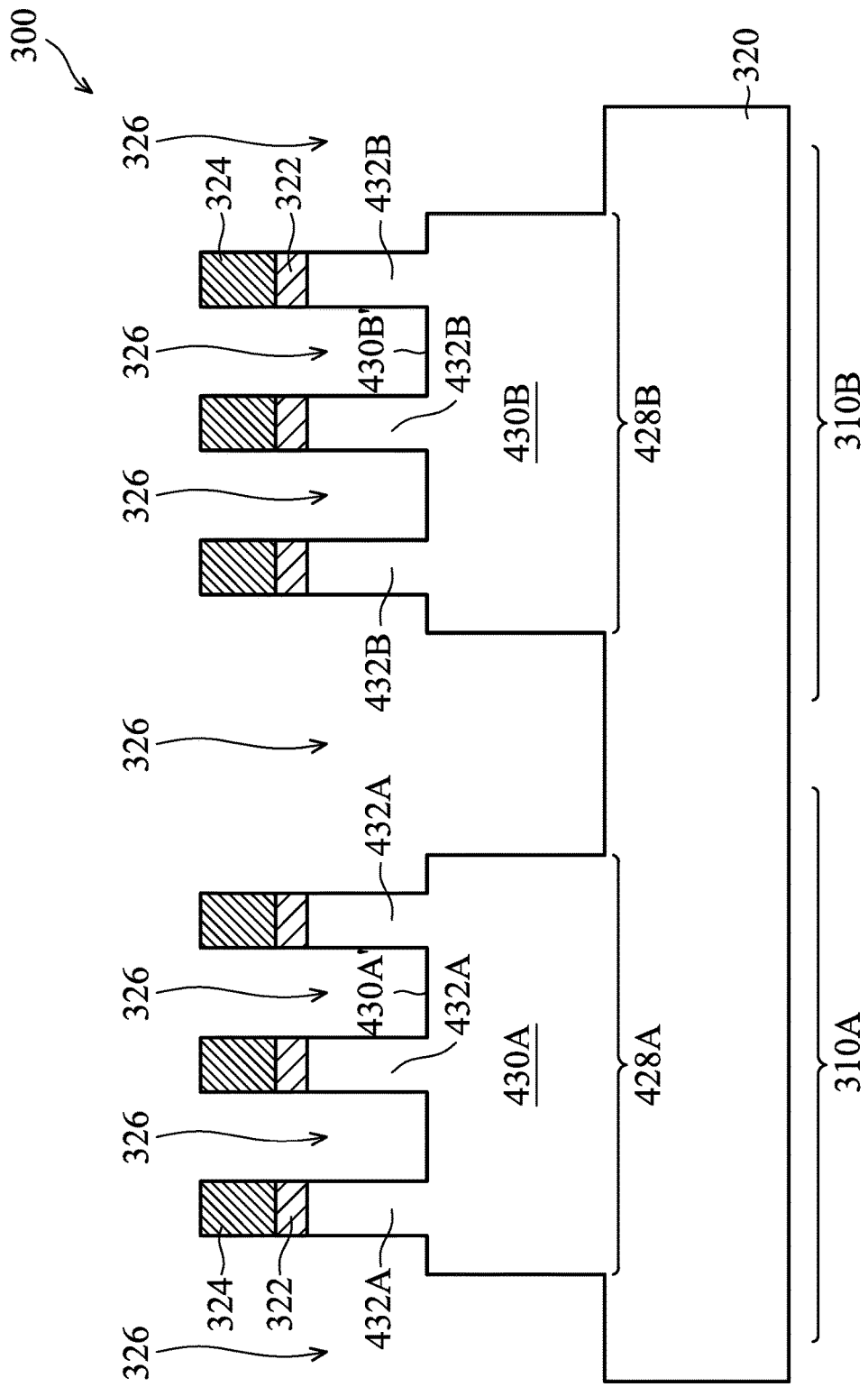

Next, as shown in FIG. 4, hard mask 324, pad oxide 322, and substrate 320 are patterned to form trenches 326, during which hard mask 324 is patterned first, and is then used as an etching mask to pattern the underlying pad oxide 322 and substrate 320. Accordingly, semiconductor strips 428A and 428B are formed in NMOS region 310A and PMOS region 310B, respectively. Trenches 326 extend into semiconductor substrate 320, and separate semiconductor strips 428A and 428B from each other. In the top view of wafer 300, each or some of semiconductor strips 428A and 428B may be encircled by respective trenches 326.

In accordance with some embodiments of the present disclosure, semiconductor strips 428A and 428B are referred to as crown-shape semiconductor strips. Semiconductor strip 428A includes semiconductor base 430A and semiconductor strips 432A over base 430A. Semiconductor strip 428B includes semiconductor base 430B and semiconductor strips 432B over base 430B. Although FIG. 4 illustrates that there are three semiconductor strips 432A (or 432B) over base 430A (or 430B), the number of semiconductor strips 432A and 432B on each of the respective bases 430A and 430B may be any integer number such as 1, 2, 3, 4, 5, or more, depending on the desirable drive currents of the resulting FinFETs. The top surface 430A' of base 430A and top surface 430B' of base 430B may be substantially planar, or may be curved with dishing. In some embodiments, semiconductor strips 428A and 428B are not formed having a crown-shape, and in some cases bases 430A and 430B may not be present. In some cases, semiconductor strips 432A and 432B may be formed directly over the substrate 320.

In accordance with some embodiments of the present disclosure, the formation of semiconductor strips 428A and 428B includes etching semiconductor substrate 320 to form strips 432A and 432B, forming sacrificial spacer layers (not shown) to cover the sidewalls of semiconductor strips 432A and 432B, and using the sacrificial spacer layers and hard masks 324 in combination as an etching mask to further etch semiconductor substrate 320. The neighboring semiconductor strips 432A are close to each other, and hence the portions of semiconductor substrate 320 between neighboring semiconductor fins 432A/432B are not etched down. As a result, bases 430A and 430B are formed. The sacrificial spacer layers are then removed.

Figure 5:
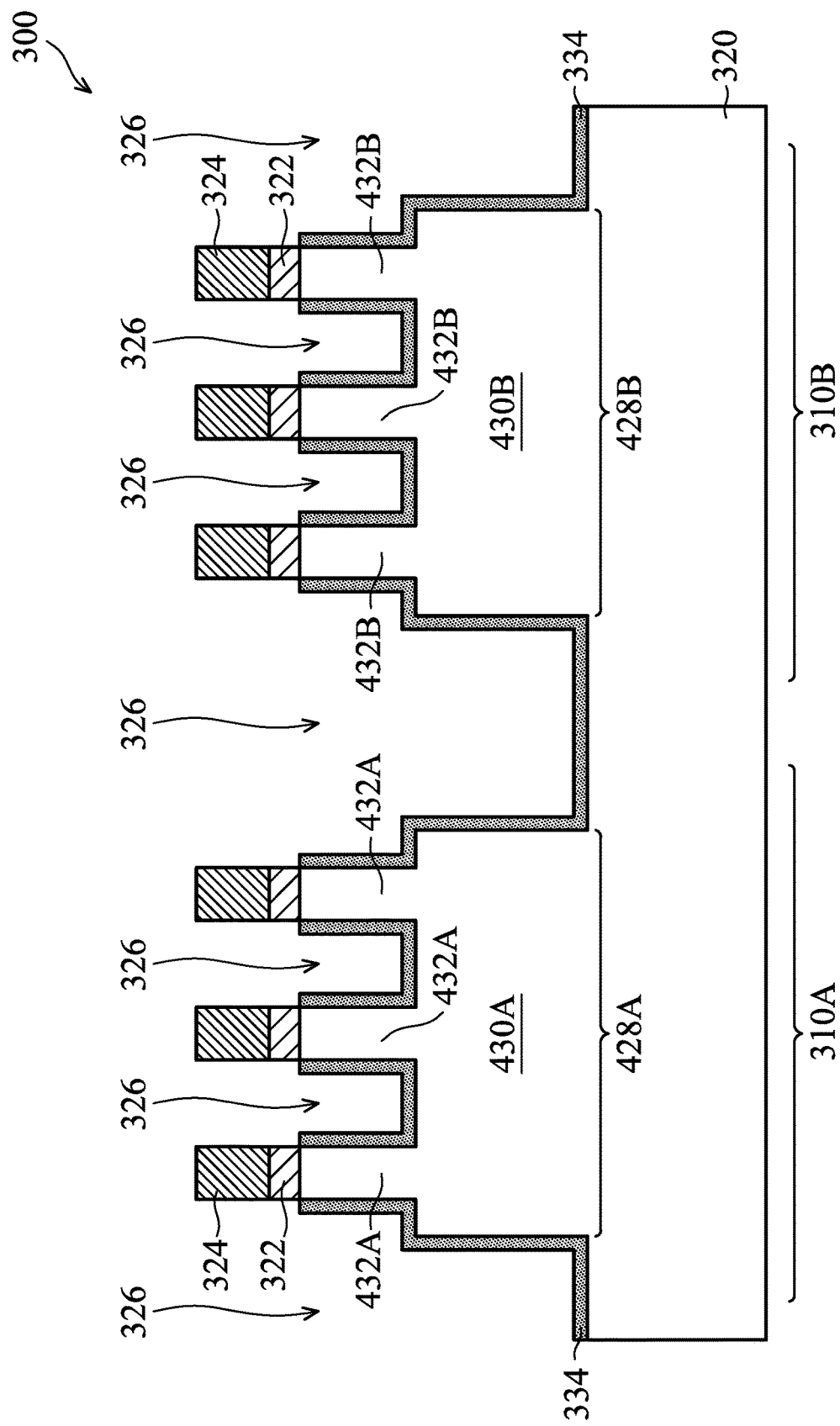
Figure 6:
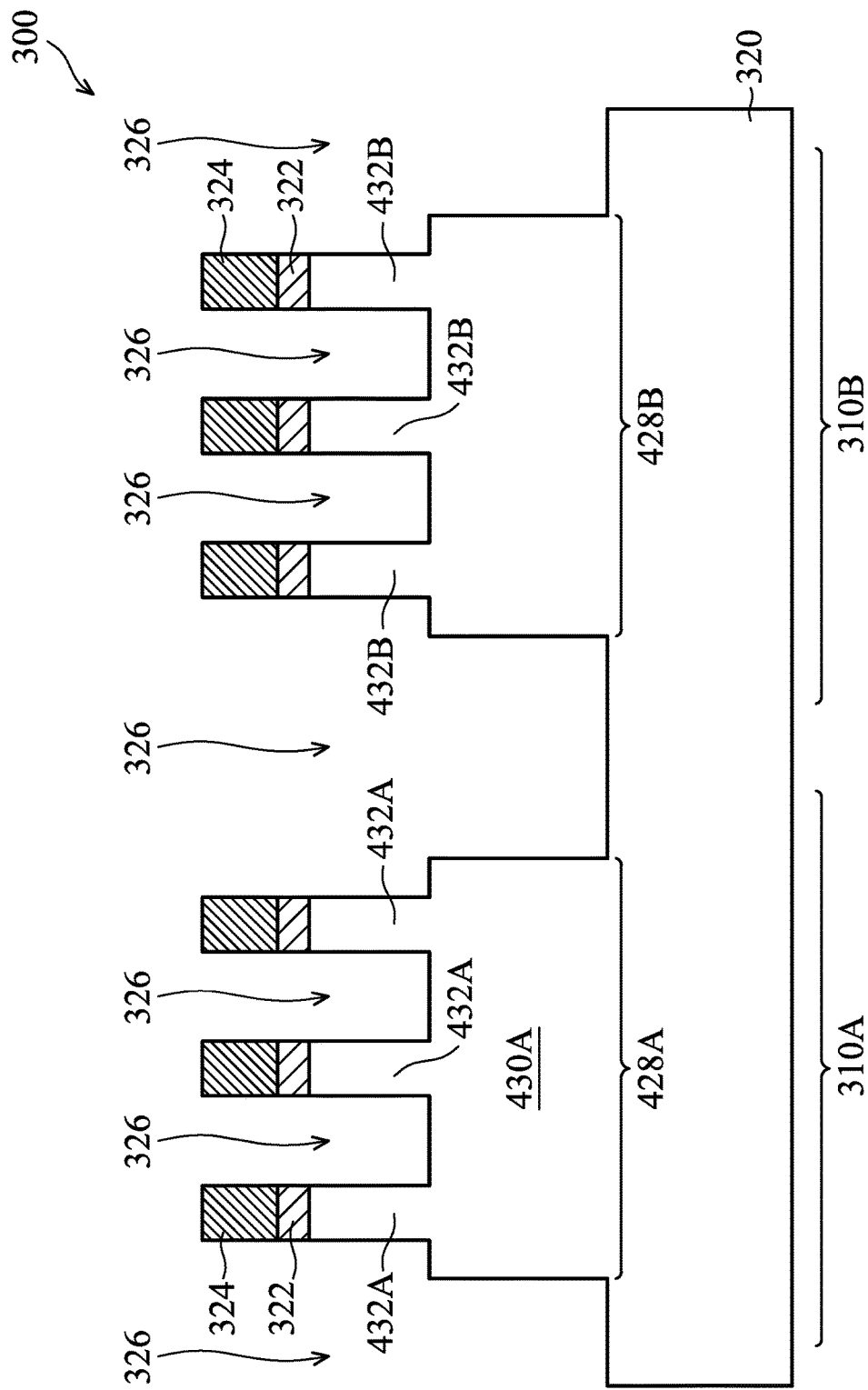

FIGS. 5 and 6 illustrate the formation and the removal of sacrificial liner oxide layer 334, which is formed on the exposed surfaces of crown-shape semiconductor strips 428A and 428B. Referring to FIG. 5, sacrificial liner oxide layer 434 is formed as a conformal layer, whose horizontal portions and vertical portions have thicknesses close to each other. In accordance with some embodiments of the present disclosure, sacrificial liner oxide layer 334 is formed by oxidizing wafer 300 in an oxygen-containing environment, for example, through Local Oxidation of Silicon (LOCOS), wherein oxygen ($O_2$) may be included in the respective process gas. In accordance with other embodiments of the present disclosure, sacrificial liner oxide layer 334 is formed using In-Situ Steam Generation (ISSG), for example, with water steam or a combined gas of hydrogen ($H_2$) and oxygen ($O_2$) used to oxidize the exposed semiconductor substrate 320 and crown-shape semiconductor strips 428A and 428B. The ISSG oxidation may be performed at an elevated temperature higher than room temperature.

Sacrificial liner oxide layer 334 is then removed, for example, in a wet etching or dry etching process, wherein HF solution or a combined gas of $NH_3$ (ammonia) and $HF_3$ may be used. The resulting structure is shown in FIG. 6. As a result, the surfaces of crown-shape semiconductor strips 428A and 428B are revealed again. The formation and the removal of sacrificial liner oxide layer 334 may cause advantageous re-profile of the surfaces of crown-shape semiconductor strips 428A and 428B. For example, some undesired protrusions may be removed due to the higher oxidation rate of protrusions than smooth portions. The performance of the resulting FinFETs may thus benefit from the formation and the removal of sacrificial liner oxide layer 334.

Figure 7:
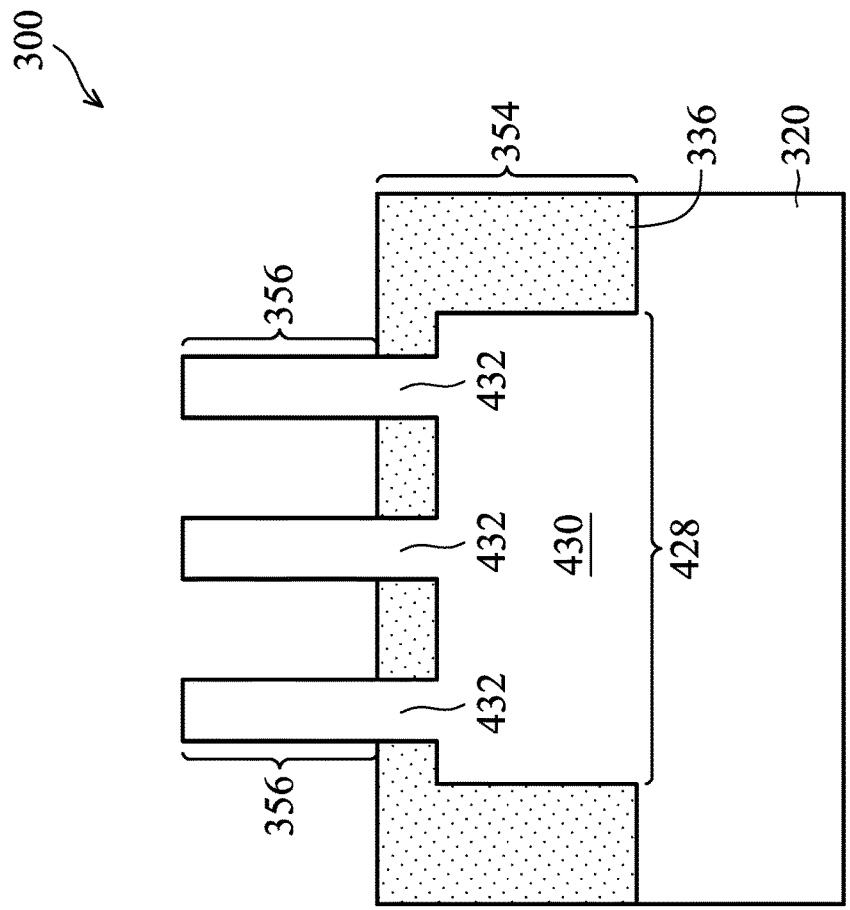

In the subsequent process steps, n-type FinFETs and p-type FinFETs are formed, for example, in NMOS region 310A and PMOS region 310B, respectively. The subsequent drawings illustrate the formation of one FinFET, which represents both n-type FinFETs and p-type FinFETs. For example, referring to FIG. 7, when the respective FinFET that is to be formed is an n-type FinFET, the structure shown in FIG. 7 represents the structure shown in NMOS region 310A (FIG. 6). Accordingly, strips 432 represent semiconductor strips 432A, and crown-shape semiconductor strip 428 represents semiconductor strip 428A. When the respective FinFET that is to be formed is a p-type FinFET, the structure shown in FIG. 7 represents the structure shown in PMOS region 310B (FIG. 6). Accordingly, strips 432 represent semiconductor strips 432B, and crown-shape semiconductor strip 428 represents semiconductor strip 428B. It is appreciated that both the n-type and p-type FinFETs are formed on the same wafer 300 and in the same chips.

FIG. 7 illustrates the formation and recess of dielectric material to form Shallow Trench Isolation (STI) regions 354, which fills the trenches separating semiconductor strips. The dielectric material may be formed of SiO, SiC, SiN, or multilayers thereof. The formation method of the dielectric material may be selected from Flowable Chemical Vapor Deposition (FCVD), spin-on coating, Chemical Vapor Deposition (CVD), ALD, High-Density Plasma Chemical Vapor Deposition (HDPCVD), LPCVD, and the like. The dielectric material may be free from n-type and p-type dopants. In accordance with some embodiments in which FCVD is used, a silicon-containing precursor (for example, trisilylamine (TSA) or disilylamine (DSA)) is used, and the resulting dielectric material is flowable (jelly-like). In accordance with alternative embodiments of the present disclosure, the flowable dielectric material is formed using an alkylamino silane based precursor. During the deposition, plasma is turned on to activate the gaseous precursors for forming the flowable oxide.

After the dielectric material is formed, an anneal step is performed on wafer 300. The dielectric material, if being flowable at this time, will be converted into a solid dielectric material. The anneal also improves the quality of the dielectric material, for example, resulting in the increase in the density of the dielectric material. In accordance with some embodiments of the present disclosure, the anneal is performed using a method selected from furnace anneal, chamber anneal, tube anneal or the like. For example, when furnace anneal is performed, the annealing temperature may be between about 750° C. and about 1,050° C., and the anneal duration may be in the range between about 10 minutes and about 30 minutes. The annealing may be performed in an oxygen-containing environment or in an environment not containing oxygen ($O_2$, $O_3$, or the like).

The dielectric material is then recessed to form STI regions 354, and pad layer 322 (FIG. 6) may also be removed in the same process. The recessing of STI regions 354 may be performed using an isotropic etching process, which may be a dry etch process or a wet etch process. The recessing of STI regions 354 results in the top portions of semiconductor strips 432 to protrude over the top surfaces of STI regions 354. The protruding portions are referred to as semiconductor fins (or protruding fins) 356 hereinafter.

Figure 8:
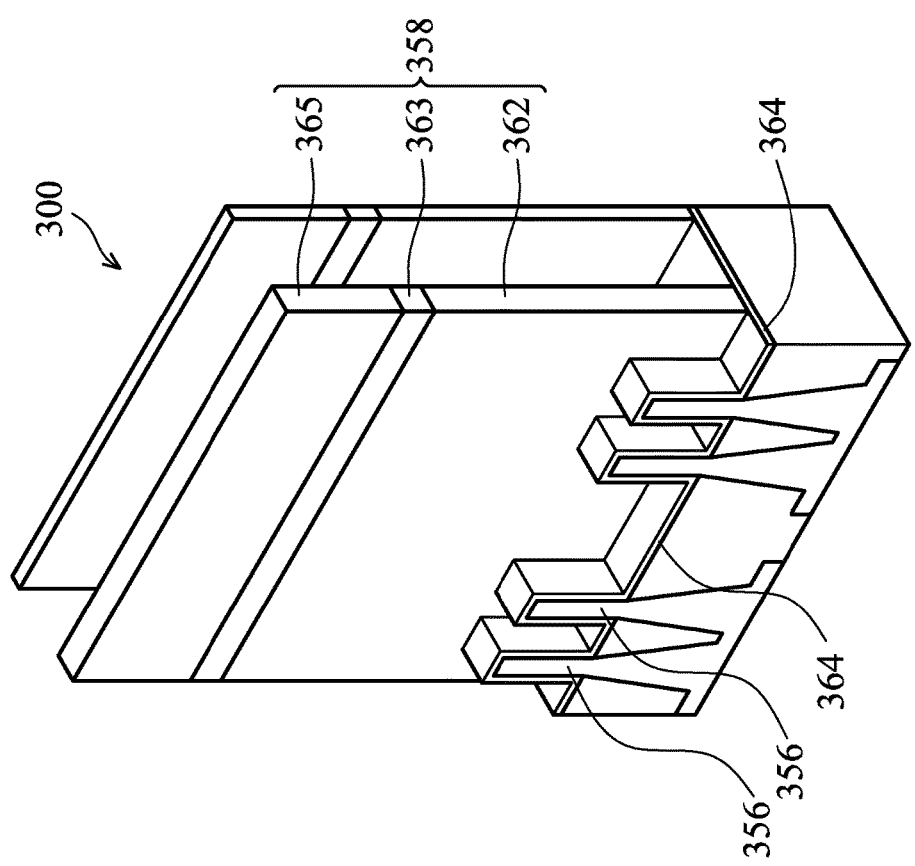

FIG. 8 illustrates the perspective view of the formation of dummy gate stack 358 in accordance with some embodiments of the present disclosure. Dummy gate stack 358 may include dummy gate dielectric 364 and dummy gate electrode 362 over dummy gate dielectric 360. Dummy gate dielectric 364 may be formed of silicon oxide, or another material. Dummy gate electrode 362 may be formed of polysilicon in accordance with some embodiments. Mask 363, such as a hard mask, may be formed of SiN, SiCN, or another material, may be formed over dummy gate electrode 362. An additional mask 365, such as a hard mask, may be formed over hard mask 363, and may be formed of silicon oxide, or another material.

Figure 9A:
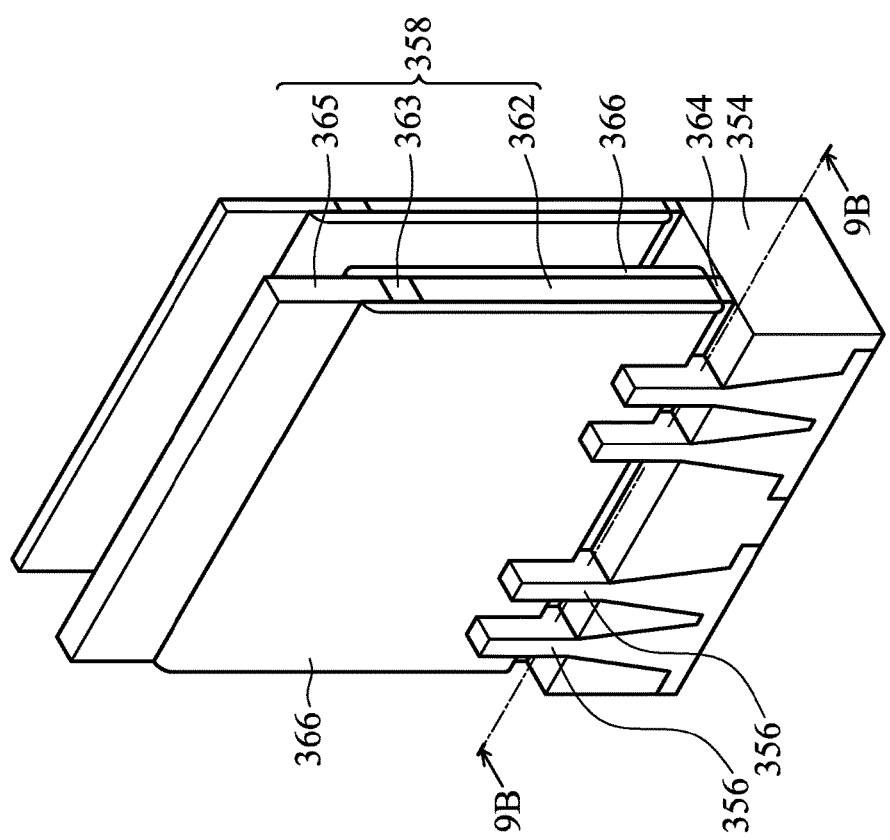

Referring to FIG. 9A, a spacer layer 366 is formed over the dummy gate stack 358 using a selective deposition process, and then portions of dummy gate dielectric 364 are removed. In accordance with some embodiments of the present disclosure, spacer layer 366 is formed using a selective deposition process such as that described above with respect to FIGS. 1A-1I. For example, prior to forming spacer layer 366, an inhibitor may be formed over exposed surfaces of STI regions 354, dummy gate dielectric 364, and mask 365, using a process such as that described above with respect to FIG. 1C. Spacer layer 366 may include a material such as SiN, SiOC, SiCN, SiOCN, or another material or combination of materials. Due to the selective deposition process including intermittent purges, the spacer layer 366 is formed only on exposed surfaces of the dummy gate electrode 362 and mask 363. In some embodiments, the spacer layer 366 is formed to a thickness between about 10 Å and about 100 Å. By using the selective deposition process to form spacer layer 366, photolithographic steps to remove portions of a spacer layer formed over the hard mask 365 or over the semiconductor fins 356 may not be needed. Thus, in some cases, the number of processing steps may be reduced by using the selective deposition process described herein.

After deposition of spacer layer 366, portions of dummy gate dielectric 364 covering semiconductor fins 356 and STI regions 354 are removed using an etching process (e.g., a wet etch or a dry etch). A portion of dummy gate dielectric is left remaining underneath dummy gate electrode 362, as illustrated in FIG. 9A.

Figure 9B:
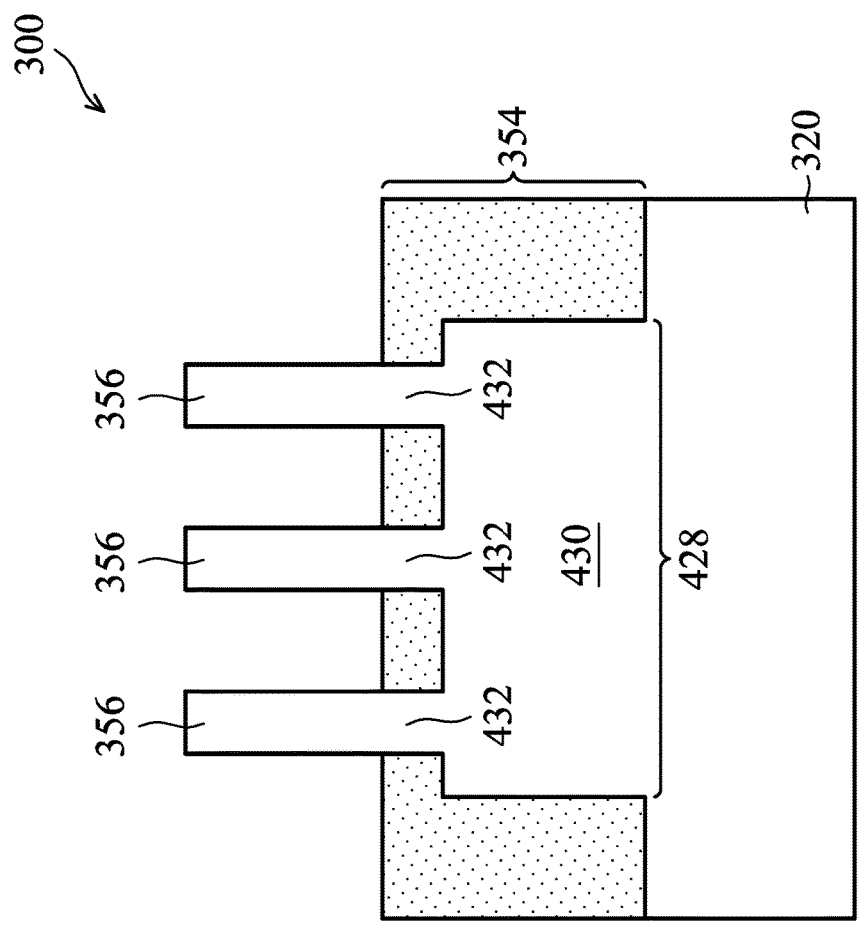

FIG. 9B illustrates a cross-sectional view of a portion of the structure shown in FIG. 9A, wherein the cross-sectional view is obtained from the vertical plane crossing line 9B-9B in FIG. 9A. The cross-sectional view shown in subsequent FIGS. 10A and 10B are also obtained from the same vertical plane (which passes through an uncovered portion of semiconductor fin(s) 56) crossing line 9B-9B as shown in FIG. 9A.

Figure 10A:
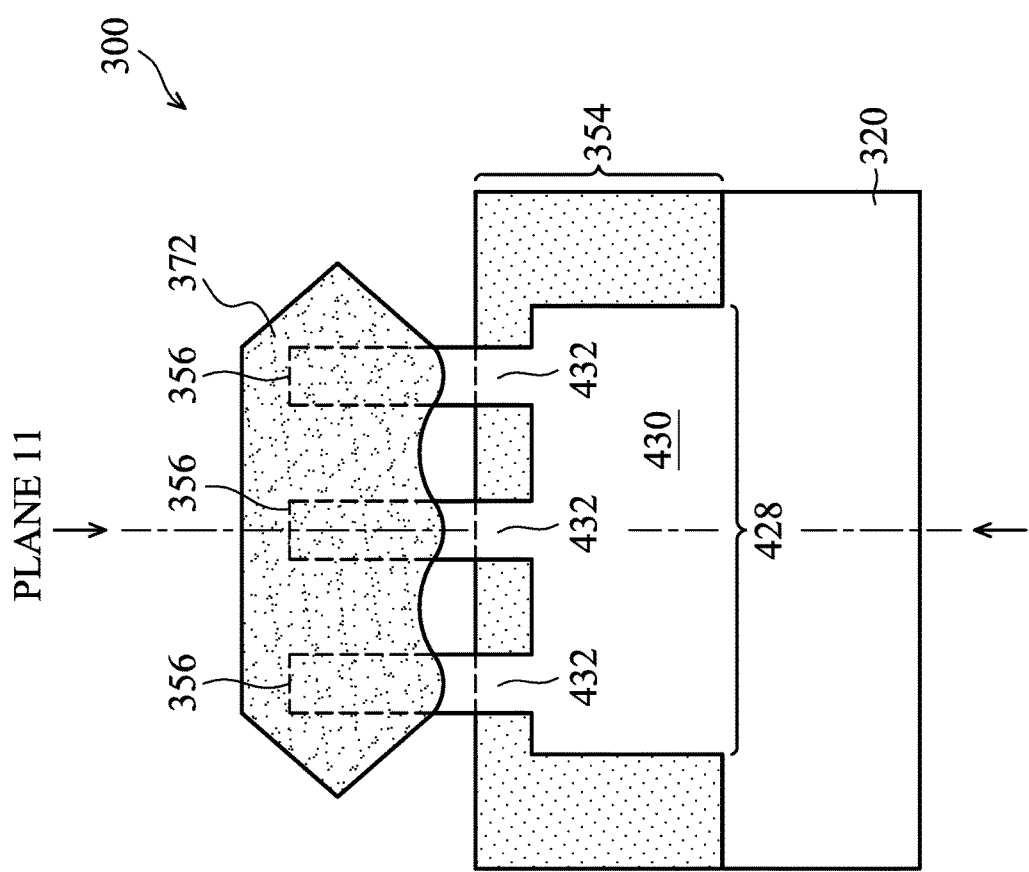
Figure 10B:
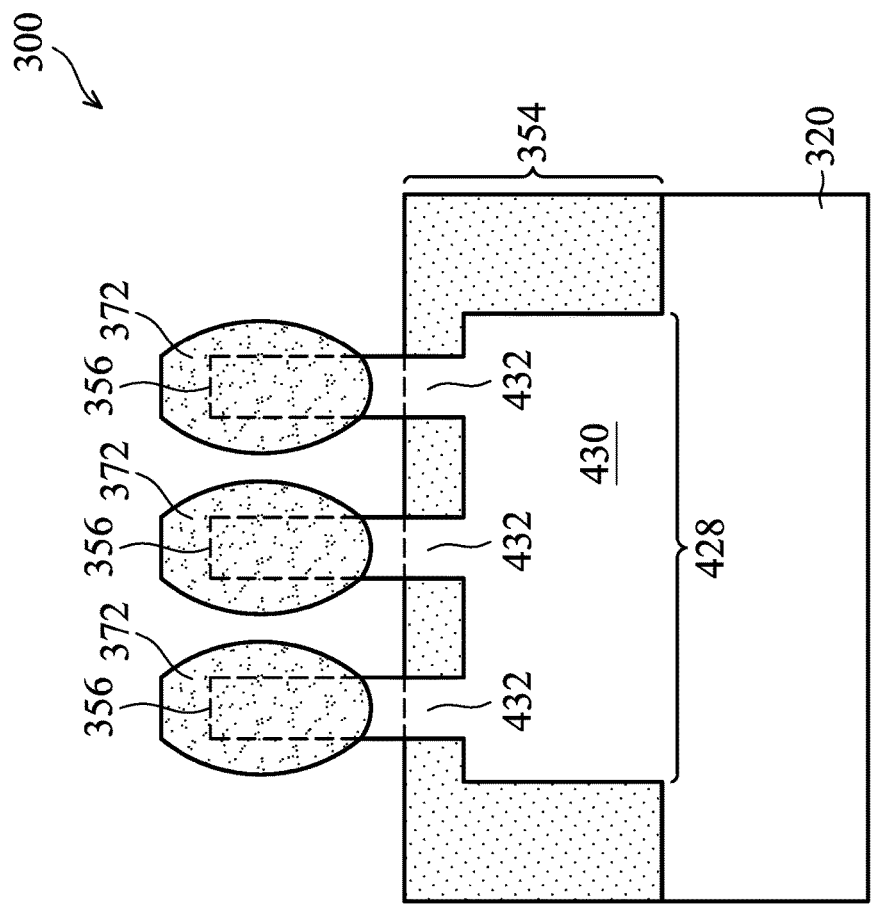

Next, as shown in FIGS. 10A and 10B, the exposed portions of semiconductor fins 356 are recessed in an etching process, and epitaxy region 372 is grown from remaining fins 356 or strip 432. FIGS. 10A and 10B show the same cross-sectional view obtained from the vertical plane crossing line 9B-9B in FIG. 9A. FIG. 10A shows epitaxy region 372 as merged between each of fins 356, but in other embodiments a separated epitaxy region 372 may be grown on each fin 356, as shown in FIG. 10B. Epitaxy region 372 forms the source/drain region of the resulting FinFET. Epitaxy region 372 may include silicon germanium doped with boron when the respective FinFET is a p-type FinFET, or may include silicon phosphorous or silicon carbon phosphorous when the respective FinFET is an n-type FinFET.

Figure 11:
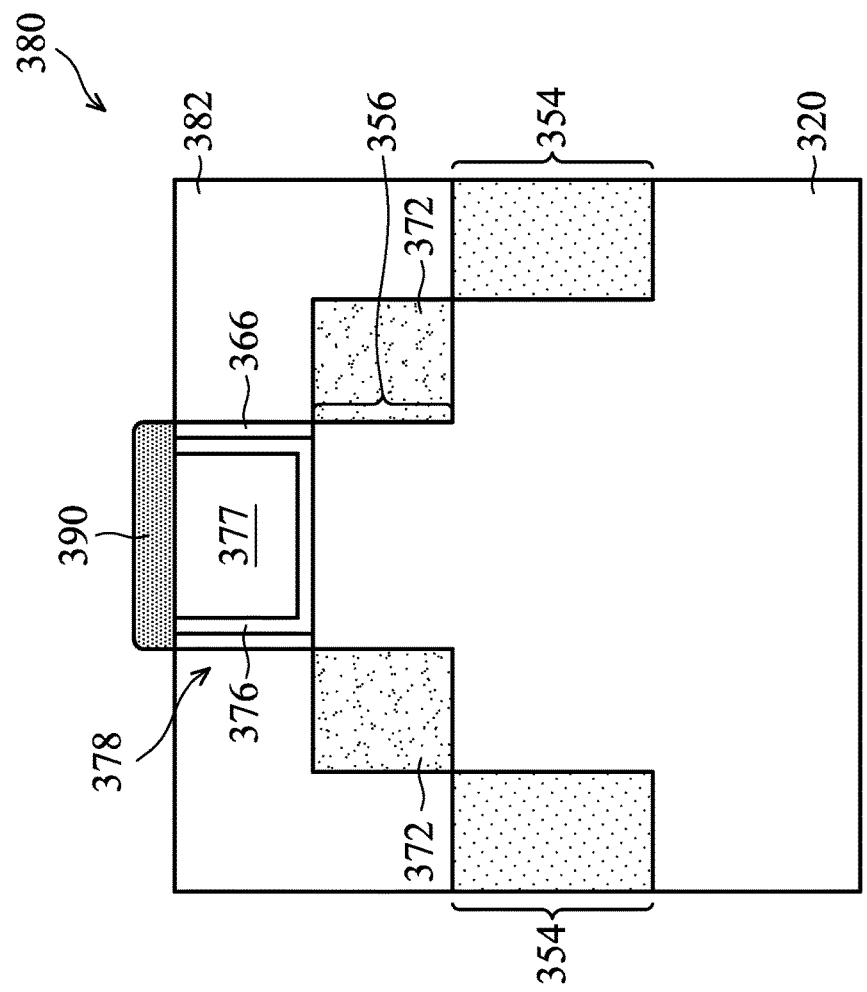

Subsequently, a plurality of process steps is performed to finish the formation of the FinFET. An exemplary FinFET 380 is illustrated in a cross-sectional view in FIGS. 11 and 12, wherein the cross-sectional view is obtained through the vertical plane labeled "PLANE 11" in FIG. 10A. The dummy gate stack 358 as shown in FIG. 9A is replaced with a replacement gate stack 378 as shown in FIG. 11. Replacement gate stack 378 includes gate dielectric 376 on the top surfaces and sidewalls of the respective fin 356, and gate electrode 377 over gate dielectric 376. Gate dielectric 376 may be formed through thermal oxidation, and hence may include thermal silicon oxide. In some embodiments, prior to formation of gate dielectric 376, an interfacial layer is formed on the exposed surfaces of the respective fin 356. The interfacial layer may include an oxide layer such as a silicon oxide layer, which may be formed through the thermal oxidation of the respective fin 356, a chemical oxidation process, or a deposition process. In some cases, the interfacial layer may include a silicon nitride layer, and in some cases the interfacial layer may include one or more layers of silicon oxide, silicon nitride, or another material. The formation of gate dielectric 376 may also include one or a plurality of deposition steps, and the resulting gate dielectric 376 may include a high-k dielectric material or a non-high-k dielectric material. Gate electrode 377 is then formed on gate dielectric 376, and may be formed of metal layers. An Inter-Layer Dielectric (ILD) 382 is also formed over and around epitaxy regions 372, spacer layer 366, and dummy gate stack 358. ILD 382 may be, for example a silicon oxide. The formation processes of the replacement gate stack may include forming additional layers such as barrier layers, capping layers, work-function layers, or other layers not shown in FIG. 11 for clarity. These additional layers may include materials such as TiN, TaN, W, SiN, SiOCN, or other materials.

As illustrated in FIG. 11, a dielectric cap 390 is formed over replacement gate stack 378 using selective deposition techniques described herein. For example, an inhibitor may first be formed over exposed surfaces of ILD 382, and the dielectric cap 390 deposited over exposed surfaces of replacement gate stack 378. Dielectric cap 390 may be a material such as SiN, SiOCN, or another material. In some embodiments, dielectric cap 390 is formed to a thickness between about 10 Å and about 100 Å. Dielectric cap 390 may be used as an etch stop during subsequent processing, described in greater detail below. Dielectric cap 390 material is selectively deposited only over the replacement gate stack 378 and not over ILD 382. In this manner, surfaces of ILD 382 remain exposed for subsequent processing, and additional photolithographic or etching steps to remove unwanted precursor material over surfaces of ILD 382 may not be needed.

Figure 12:
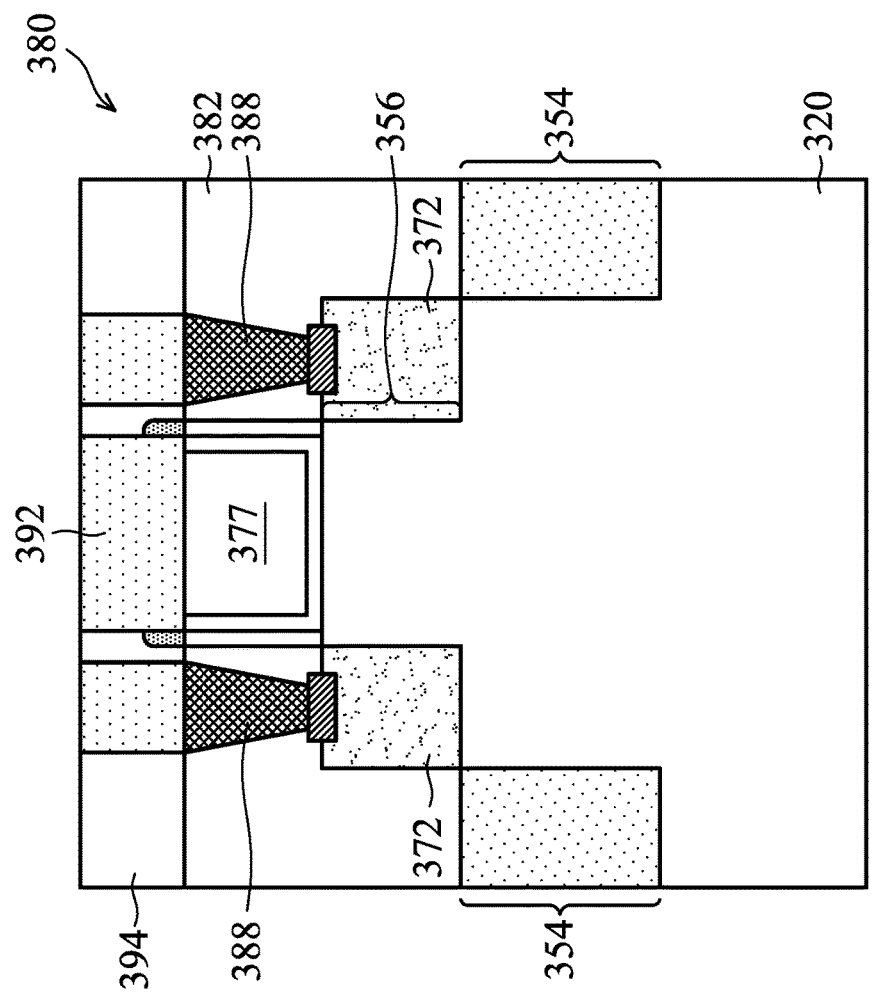

As illustrated in FIG. 12, gate contact plug 392 and source/drain contact plugs 388 are formed to electrically connect the replacement gate stack 378 and source/drain regions 372, respectively. A dielectric layer 394 is formed over ILD 382 and dielectric cap 390. Openings are etched into dielectric layer 394, using dielectric cap 390 as an etch stop layer. The openings then are filled with conductive material to form gate contact plug 392 and source/drain contact plugs 388. In other embodiments, gate contact plug 392 and source/drain contact plugs 388 may be formed using separate photolithographic and etching steps. The formation of gate contact plug 392 or source/drain contact plugs 388 may also include additional steps not described in detail here.

The embodiments of the present disclosure have some advantageous features. By increasing the selectivity of the deposition process, fewer processing steps may be required. For example, steps removing and recoating an inhibitor may be reduced or eliminated. The increased selectivity may also allow films of arbitrary thickness to be deposited. The increased selectivity also can allow deposition on surfaces within non-planar surfaces or surfaces within narrow spaces, such as inner surfaces of a small trench or opening, or surfaces under an overhanging structure. The embodiments of the present disclosure may be applicable to various deposition techniques, such as ALD, plasma-enhanced ALD (PEALD), Chemical Vapor Deposition (CVD), or other deposition techniques. The embodiments may also be applied to the selective deposition of different types of materials, such as high-k materials, low-k materials, metal nitrides, or other types of materials. The embodiments may be applied to selective deposition between different types and combinations of surface materials, such as silicon surfaces, metal surfaces, dielectric surfaces, or surfaces of other materials.

In an embodiment, a method includes depositing an inhibitor layer on a first surface of a semiconductor device and depositing a film on a second surface of the semiconductor device by performing a first set of deposition cycles, wherein each deposition cycle includes adsorbing a first precursor over the second surface; performing a first purge process; adsorbing a second precursor over the second surface; and performing a second purge process. The method also includes performing a third purge process that is different from the first purge process or the second purge process. In an embodiment, the method further includes performing a second set of deposition cycles and performing the third purge process. In an embodiment, the first set of deposition cycles comprises between about 30 and about 50 cycles. In an embodiment, the first surface is a first material and the second surface is a second material that is different from the first material. In an embodiment, the first material includes a silicon oxide and the second material includes silicon. In an embodiment, the first purge process includes flowing a gas over the first surface and the second surface for a first duration of time. In an embodiment, the third purge process includes flowing a gas over the first surface and the second surface for a second duration of time that is greater than the first duration of time. In an embodiment, depositing the film includes using an Atomic Layer Deposition (ALD) process. In an embodiment, the film includes SiN. In an embodiment, the inhibitor layer is free of the first precursor or the second precursor after performing a third purge process.

In an embodiment, a method of forming a device includes forming a gate structure of the device over a semiconductor substrate; treating a first surface of the device to suppress the adsorption of first precursors or second precursors onto the first surface of the device; exposing the device to first precursors and exposing the device to second precursors to form a first portion of a dielectric layer on a second surface of the gate structure of the device, wherein the second surface is adjacent the first surface and wherein the second surface is a different material than the first surface; flowing a gas over the first surface to remove first precursors and second precursors from the first surface; and exposing the device to first precursors and second precursors to form a second portion of the dielectric layer on the first portion of the dielectric layer. In an embodiment treating the first surface to suppress the adsorption of first precursors or second precursors onto the first surface includes forming an inhibitor on the first surface. In an embodiment the first surface is an oxide. In an embodiment, the method further includes flowing a gas over the first surface to remove first precursors and second precursors from the first surface after depositing the first precursors and the second precursors on the dielectric layer. In an embodiment, the gate structure is a dummy gate stack. In an embodiment, the gas is $N_2$. In an embodiment, the dielectric layer includes SiN.

In an embodiment, a method, includes forming a dummy gate stack on a substrate, the dummy gate stack including a first material and a second material that is different than the first material; forming a gate spacer layer over a first surface of the first material of the dummy gate stack, including forming an inhibitor over a second surface of the second material; and exposing the first surface of the first material and the inhibitor to a precursor; forming multiple source/drain regions in the substrate; removing the dummy gate stack to leave an opening; and forming a replacement gate stack within the opening. In an embodiment, the replacement gate stack includes a third material, and the method further includes forming an interlayer dielectric layer (ILD) adjacent the replacement gate stack; and forming an etch stop layer over a third surface of the third material of the replacement gate stack, including forming an inhibitor over a fourth surface of the ILD; and exposing the third surface of the third material and the fourth surface of the ILD to a precursor. In an embodiment, the gate spacer layer includes SiN. In an embodiment, the gate spacer layer is formed to a thickness between about 50 Å and about 100 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an inhibitor layer on a first surface of a semiconductor device;
   depositing a film on a second surface of the semiconductor device by performing a first set of deposition cycles, wherein the first surface is a first material and the second surface is a second material that is different from the first material, wherein the first material comprises an oxide, and wherein each deposition cycle comprises:
      adsorbing a first precursor over the second surface;
      performing a first purge process;
      adsorbing a second precursor over the second surface; and
      performing a second purge process; and
   performing a third purge process that is different from the first purge process or the second purge process.

2. The method of claim 1, further comprising:
   performing a second set of deposition cycles; and
   performing the third purge process.

3. The method of claim 1, wherein the first set of deposition cycles comprises between about 30 and about 50 cycles.

4. The method of claim 1, wherein the first purge process comprises flowing a gas over the first surface and the second surface for a first duration of time.

5. The method of claim 1, wherein the third purge process comprises flowing a gas over the first surface and the second surface for a second duration of time that is greater than the first duration of time.

6. The method of claim 1, wherein depositing the film comprises using an Atomic Layer Deposition (ALD) process.

7. The method of claim 1, wherein the film comprises SiN.

8. The method of claim 1, wherein the inhibitor layer is free of the first precursor or the second precursor after performing a third purge process.

9. The method of claim 1, wherein the second material comprises polysilicon.

10. The method of claim 1, wherein the third purge process comprises a process temperature between 400° C. and 500° C.

11. A method of forming a device comprising:
    forming a gate structure of the device over a semiconductor substrate;
    treating a first surface of the device to suppress the adsorption of first precursors or second precursors onto the first surface of the device;
    exposing the device to first precursors and exposing the device to second precursors to form a first portion of a dielectric layer on a second surface of the gate structure of the device, wherein the second surface is adjacent the first surface and wherein the second surface is a different material than the first surface;
    flowing a gas over the first surface to remove first precursors and second precursors from the first surface; and
    exposing the device to first precursors and second precursors to form a second portion of the dielectric layer on the first portion of the dielectric layer.

12. The method of claim 11, wherein treating the first surface to suppress the adsorption of first precursors or second precursors onto the first surface comprises forming an inhibitor on the first surface.

13. The method of claim 11, wherein the first surface is an oxide.

14. The method of claim 11, further comprising flowing a gas over the first surface to remove first precursors and second precursors from the first surface after depositing the first precursors and the second precursors on the dielectric layer.

15. The method of claim 11, wherein the gate structure is a dummy gate stack.

16. The method of claim 11, wherein the dielectric layer comprises SiN.

17. A method, comprising:
    forming a dummy gate stack on a substrate, the dummy gate stack comprising a first material and a second material that is different than the first material;
    forming a gate spacer layer over a first surface of the first material of the dummy gate stack, comprising:
       forming an inhibitor over a second surface of the second material; and
       exposing the first surface of the first material and the inhibitor to a precursor;
    forming a plurality of source/drain regions in the substrate;
    removing the dummy gate stack to leave an opening; and
    forming a replacement gate stack within the opening.

18. The method of claim 17, wherein the replacement gate stack comprises a third material, and further comprising:
    forming an interlayer dielectric layer (ILD) adjacent the replacement gate stack; and
    forming an etch stop layer over a third surface of the third material of the replacement gate stack, comprising:
       forming an inhibitor over a fourth surface of the ILD; and
       exposing the third surface of the third material and the fourth surface of the ILD to a precursor.

19. The method of claim 17, wherein the gate spacer layer comprises SiN.

20. The method of claim 17, wherein the gate spacer layer is formed to a thickness between about 10 Å and about 100 Å.

* * * * *